United States Patent
Takeishi (10) Patent No.: US 11,342,233 B2
(45) Date of Patent: May 24, 2022

(54) WAFER POLISHING METHOD

(71) Applicant: DISCO CORPORATION, Tokyo (JP)

(72) Inventor: Yasuyuki Takeishi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 134 days.

(21) Appl. No.: 17/029,939

(22) Filed: Sep. 23, 2020

(65) Prior Publication Data

US 2021/0098316 A1 Apr. 1, 2021

(30) Foreign Application Priority Data

Sep. 30, 2019 (JP) .............................. JP2019-179467

(51) Int. Cl.
*H01L 21/00* (2006.01)
*H01L 21/66* (2006.01)
*H01L 21/683* (2006.01)
*H01L 21/02* (2006.01)

(52) U.S. Cl.
CPC ........ *H01L 22/26* (2013.01); *H01L 21/02035* (2013.01); *H01L 21/6838* (2013.01)

(58) Field of Classification Search
CPC .... H01L 22/20; H01L 22/26; H01L 21/02035
See application file for complete search history.

(56) References Cited

U.S. PATENT DOCUMENTS

2017/0216991 A1* 8/2017 Yamaguchi ............. B24B 49/16

FOREIGN PATENT DOCUMENTS

JP 2016215284 A 12/2016

* cited by examiner

*Primary Examiner* — Reema Patel
(74) *Attorney, Agent, or Firm* — Greer Burns & Crain Ltd.

(57) ABSTRACT

A wafer polishing method includes moving a polishing pad to a standby position where a gap is defined between the upper surface of a wafer held on a holding unit and the lower surface of the polishing pad, lowering the polishing pad from the standby position by a preset distance at a preset speed, determining whether or not a load measured by a load sensor is greater than or equal to a preset threshold value in a rest condition of the polishing pad after lowering the polishing pad, repeatedly the lowering the polishing pad until it is determined that the load measured by the load sensor is greater than or equal to the threshold value, and polishing the wafer in the condition where a load falling in a predetermined load range including the threshold value.

1 Claim, 7 Drawing Sheets

WAFER POLISHING METHOD

BACKGROUND OF THE INVENTION

Field of the Invention

The present invention relates to a polishing method for a workpiece such as a semiconductor wafer.

Description of the Related Art

A polishing apparatus is disclosed in Japanese Patent Laid-Open No. 2016-215284, for example. This polishing apparatus includes a chuck table for holding a wafer and a polishing pad for polishing the wafer held on the chuck table as a slurry is supplied to the wafer. In this polishing apparatus, the wafer held on the chuck table has a set thickness, and the polishing pad is pressed on the wafer during polishing. That is, the polishing pad is kept in pressure contact with the wafer held on the chuck table during polishing.

That is, the polishing pad is first lowered at a high speed to a vertical position slightly above the upper surface of the wafer having the set thickness. Thereafter, the polishing pad is lowered from this vertical position at a low speed of 5 μm/s, for example (air cut lowering operation), in the condition where a load applied from the polishing pad to the wafer can be measured and detected. Thereafter, the polishing pad is pressed on the wafer under predetermined load to thereby polish the upper surface (work surface) of the wafer.

SUMMARY OF THE INVENTION

In the polishing apparatus mentioned above, a plurality of wafers is stored in a wafer cassette so as to be held on a plurality of shelves formed inside the wafer cassette. These plural wafers are adapted to be taken out of the wafer cassette one by one by operating a robot. Each wafer is transferred to the chuck table by the robot and then held on the chuck table. Thereafter, the wafer held on the chuck table is polished by the polishing pad. The plural wafers stored in the wafer cassette are different in thickness in the range from 100 to 200 μm, for example. It is desired to polish the plural wafers with the same polishing amount (the same amount of removal), that is, under the same polish load.

However, in the case that there are variations in input thickness of the wafer to be polished, e.g., in the case that a thick wafer having a thickness larger than the set thickness is held on the chuck table, the following problem occurs. In lowering the polishing pad to the vertical position (polish start position) slightly above the upper surface of the wafer having the set thickness at a high speed, the polishing pad may collide with the thick wafer at this vertical position, so that the upper surface of the wafer is strongly pressed by the lower surface of the polishing pad. That is, a large load greater than an allowable value is applied to the wafer to cause damage to the wafer.

Also, in the case that a thin wafer having a thickness smaller than the set thickness is held on the chuck table, the following problem occurs. After lowering the polishing pad to the vertical position slightly above the upper surface of the wafer having the set thickness at a high speed, the polishing pad is further lowered at a low speed of 5 μm/s, for example, by a distance larger than that assumed, so that much time is required until the lower surface of the polishing pad comes into contact with the upper surface of the wafer.

Accordingly, even when the plural wafers stored in the wafer cassette have different thicknesses in the case where the wafer is polished using the polishing apparatus, it is desirable that the thick wafer having a thickness larger than the set thickness and the thin wafer having a thickness smaller than the set thickness can be polished by the polishing apparatus as similarly to the wafer having the set thickness, that is, under a load falling in the same polish load range. Furthermore, it is also desirable to prevent the problem of damage to the thick wafer in lowering the polishing pad and the problem of an increase in time elapsed until the lower surface of the polishing pad comes into contact with the upper surface of the thin wafer.

It is therefore an object of the present invention to provide a wafer polishing method which can efficiently polish the wafers having different thicknesses without causing damage to the wafers.

In accordance with an aspect of the present invention, there is provided a wafer polishing method using a polishing apparatus including a holding unit having a holding surface for holding a wafer, a polishing unit having a polishing pad for polishing the wafer held on the holding surface of the holding unit in a condition where a lower surface of the polishing pad is in contact with an upper surface of the wafer, a vertical moving mechanism for moving the polishing unit in a vertical direction perpendicular to the holding surface, and a load sensor for measuring a load applied from the polishing pad to the wafer held on the holding surface, the wafer polishing method including a standby position taking step of moving the polishing pad to a standby position where a gap is defined between the upper surface of the wafer held on the holding surface and the lower surface of the polishing pad, a lowering step of lowering the polishing pad by a preset distance at a preset speed by using the vertical moving mechanism after performing the standby position taking step, a determining step of determining whether or not the load measured by the load sensor is greater than or equal to a preset threshold value in a rest condition of the polishing pad after performing the lowering step, a repeating step of repeating the lowering step and the determining step until it is determined that the load measured by the load sensor is greater than or equal to the preset threshold value by the determining step, and a polishing step of polishing the wafer in the condition where a load falling in a predetermined load range including the preset threshold value is applied to the wafer when it has been determined that the load measured by the load sensor is greater than or equal to the preset threshold value by the determining step.

According to the wafer polishing method of the present invention, the following effects can be exhibited. Even when a plurality of wafers stored in a wafer cassette has different thicknesses including large thicknesses greater than a set thickness and small thicknesses less than the set thickness, these plural wafers having different thicknesses can be polished similarly to the wafer having the set thickness, that is, can be polished in the condition where the same polish load is applied to each wafer. Furthermore, it is possible to prevent the damage to the wafer due to the collision of the polishing pad with the wafer. It is also possible to prevent an increase in time elapsed until the lower surface of the polishing pad comes into contact with the upper surface of the wafer.

The above and other objects, features, and advantages of the present invention and the manner of realizing them will become more apparent, and the invention itself will best be understood from a study of the following description and appended claim with reference to the attached drawings showing some preferred embodiments of the invention.

DETAILED DESCRIPTION OF THE PREFERRED EMBODIMENTS

In the following description, the term "X direction" means the direction (+X direction) depicted by an arrow +X in FIG. 1 and the direction (−X direction) depicted by an arrow −X in FIG. 1. Similarly, the term "Y direction" means the direction (+Y direction) depicted by an arrow +Y in FIG. 1 and the direction (−Y direction) depicted by an arrow −Y in FIG. 1. Similarly, the term "Z direction" means the direction (+Z direction) depicted by an arrow +Z in FIG. 1 and the direction (=Z direction) depicted by an arrow −Z in FIG. 1. The X direction and the Y direction are perpendicular to each other in a horizontal plane. The Z direction is a vertical direction perpendicular both to the X direction and to the Y direction.

Figure 1:
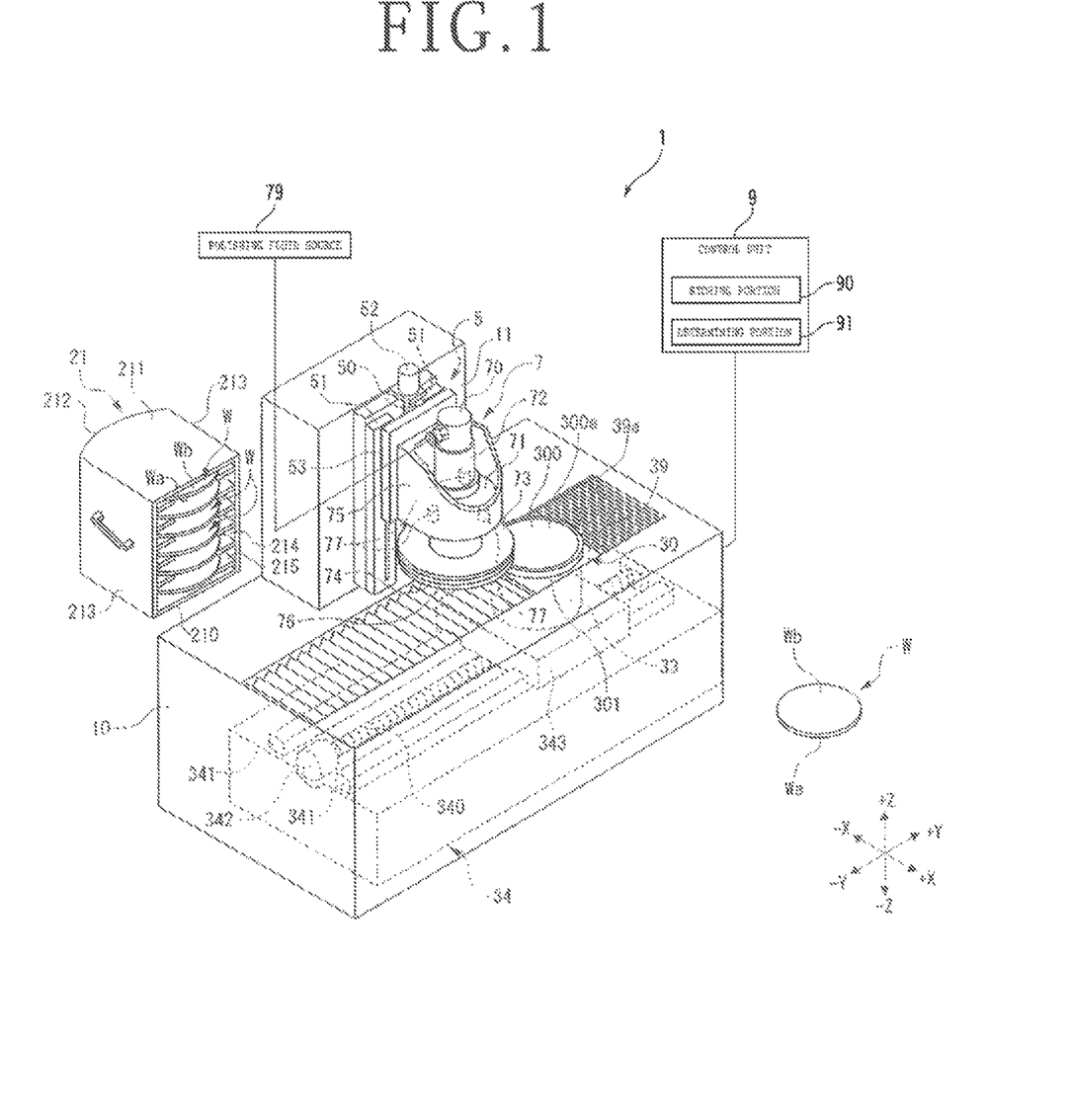
FIG. 1 is a perspective view of a polishing apparatus usable in the present invention.

Referring to FIG. 1, there is depicted a polishing apparatus 1 usable in performing the wafer polishing method according to the present invention. The polishing apparatus 1 depicted in FIG. 1 is an apparatus for polishing a wafer W held on a holding surface 300a of a holding unit 30 by using a polishing pad 76 mounted on a spindle 70 having an axis extending in the Z direction (vertical direction) perpendicular to the holding surface 300a. The polishing apparatus 1 includes a box-shaped base housing 10 elongated in the Y direction and a column 11 rising from the upper surface of the base housing 10 at its rear portion pointed in the −X direction.

The wafer W depicted in FIG. 1 is a stacked wafer obtained by stacking a plurality of semiconductor wafers. Each semiconductor wafer has a circular shape as viewed in plan, and it is formed of silicon, for example. The wafer W has an upper surface Wb as a work surface to be polished, the upper surface Wb being oriented upward in FIG. 1, and a lower surface Wa oriented downward in FIG. 1. A protective tape (not depicted) is attached to the lower surface Wa or the wafer W, so as to protect the lower surface Wa. The configuration of the wafer W depicted in FIG. 1 is merely illustrative.

The polishing apparatus 1 includes a cassette mounting table (not depicted) for mounting a wafer cassette 21 depicted in FIG. 1. As depicted in FIG. 1, a plurality of wafers W is stored in the wafer cassette 21 mounted on the cassette mounting table in such a manner that the wafers W are arranged at given intervals in the vertical direction.

The wafer cassette 21 has a bottom plate 210, a top plate 211, a rear wall 212, two side walls 213, and a front opening 214 (on the front side pointed by the +X direction). The wafers W are adapted to be taken out of the wafer cassette 21 from the front opening 214 one by one before polishing and also adapted to be returned into the wafer cassette 21 from the front opening 214 one by one after polishing. A plurality of shelves 215 is formed inside the wafer cassette 21 so as to be arranged with given intervals in the vertical direction. More specifically, the plural shelves 215 are formed on the rear wall 212 and on the two side walls 213 so as to respectively hold (mount) the plural wafers W. However, the configuration of the wafer cassette 21 is merely illustrative.

The plural wafers W stored in the wafer cassette 21 are different in thickness in the range from approximately 100 to approximately 200 μm according to the number of semiconductors stacked, and an operator knows this fact.

The holding unit 30 has a circular shape as viewed in plan. For example, the holding unit 30 is a chuck table including a suction holding portion 300 for holding the wafer W under suction and a frame portion 301 for supporting the suction holding portion 300. The suction holding portion 300 is formed of a porous material, for example. The suction holding portion 300 is connected to a vacuum source (not depicted) such as a vacuum generating apparatus, so that a suction force is produced by operating the vacuum source and then transmitted to the holding surface 300a as an upper surface (exposed surface) of the suction holding portion 300. Accordingly, the wafer W placed on the holding surface 300a of the holding unit 30 can be held under suction. The outer circumference of the holding unit 30 is surrounded by a cover 39. Further, a rotating unit (not depicted) for rotating the holding unit 30 is provided below the holding unit 30, so that the holding unit 30 is rotatable about its axis extending in the Z direction by operating the rotating unit.

A pair of bellows covers 39a is connected to the opposite side surfaces of the cover 39 so as to be elongated in the Y direction. A Y moving mechanism 34 for horizontally moving the holding unit 30 and the cover 39 is provided below the holding unit 30, the cover 39, and the pair of bellows covers 39a. The pair of bellows covers 39a is expanded and contracted in the Y direction in association with the movement of the holding unit 30 and the cover 39.

The Y moving mechanism 34 includes a base 345, a ball screw 340 supported on the base 345 and having an axis extending in the Y direction, a pair of guide rails 341 provided on the base 345 so as to extend parallel to the ball screw 340, a motor 342 connected to one end of the ball screw 340 for rotating the ball screw 340, and a movable plate 343 having an internal nut threadedly engaged with the ball screw 340 and a bottom portion (lower surface) slidably engaging with the pair of guide rails 341. Accordingly, when the motor 342 is operated to rotate the ball screw 340, the movable plate 343 is moved back and forth in the Y direction as being guided by the guide rails 341. The holding unit 30 is provided on the upper surface of the movable plate 343, so that the holding unit 30 can be moved back and forth in the Y direction by the movement of the movable plate 343.

Figure 2:
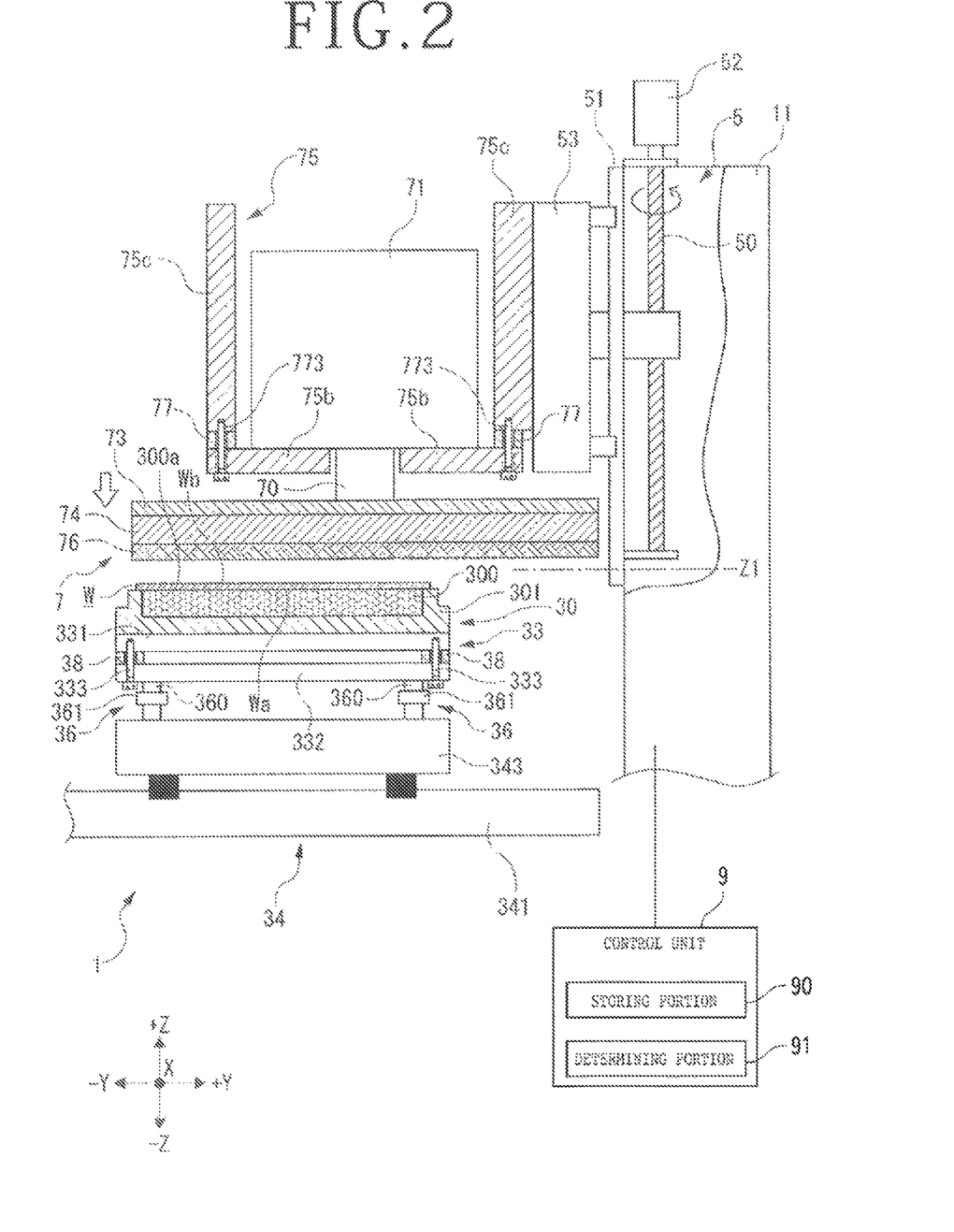
FIG. 2 is a vertical sectional view depicting structure of a polishing unit and a holding unit included in the polishing apparatus depicted in FIG. 1.

As depicted in FIG. 2, two inclination adjusting mechanisms 36 for adjusting the inclination of the holding surface 300a of the holding unit 30 are provided on the movable plate 343. Further, a support column (not depicted) for supporting the holding unit 30 is provided on the movable plate 343. More specifically, the two inclination adjusting mechanisms 36 and the support column are arranged on the upper surface of the movable plate 343 at equal intervals of 120 degrees along the outer circumference of the holding unit 30. That is, the two inclination adjusting mechanisms 36 and the support column are interposed between the movable plate 343 and the holding unit 30. Each inclination adjusting mechanism 36 is an electrically driven cylinder or an air cylinder, which includes a cylinder 361 and a rod 360 provided in the cylinder 361 so as to be vertically movable in the Z direction. However, the configuration of each inclination adjusting mechanism 36 is merely illustrative. For example, a piezoellectric element adapted to be expanded and contracted in the Z direction may be used as each inclination adjusting mechanism 36. In the preferred embodiment depicted in FIG. 2, the rods 360 of the two inclination adjusting mechanisms 36 are vertically moved to thereby adjust the inclination of the holding surface 300a.

The holding unit 30 is fixedly mounted on the upper surface of a table base 33. The table base 33 is supported by the two inclination adjusting mechanisms 36 and the support column in such a manner that the inclination of the holding surface 300a of the holding unit 30 can be adjusted by the two inclination adjusting mechanisms 36. That is, the lower surface of the table base 33 is connected to the rods 360 of the two inclination adjusting mechanisms 36 and the upper end of the support column. The table base 33 is composed of two base plates 331 and 332, each of the base plates 331 and 332 having a circular shape as viewed in plan. The base plates 331 and 332 are united together by fastening bolts 333. Further, three table load sensors 38 (only two of which being depicted in FIG. 2) are interposed between the base plates 331 and 332.

Each table load sensor 38 functions to measure a load applied from the polishing pad 76 to the wafer W held on the holding surface 300a of the holding unit 30 depicted in FIGS. 1 and 2. The three table load sensors 38 are arranged at equal intervals of 120 degrees along the outer circumference of the holding unit 30, that is, located at the three vertices of a regular triangle. The three table load sensors 38 are respectively fixed by the fastening bolts 333 between the base plates 331 and 332. Accordingly, each table load sensor 38 supports the holding unit 30 and detects a load applied to the holding unit 30 in the +Z direction. For example, each table load sensor 38 is configured by a dynamometer using a piezoelectric element as manufactured by Kistler Instrumente AG.

As depicted in FIG. 1, a vertical moving mechanism 5 for vertically moving a polishing unit 7 is provided on the front surface of the column 11. The polishing unit 7 is moved in the vertical direction perpendicular to the holding surface 300a of the holding unit 30 by operating the vertical moving mechanism 5. The vertical moving mechanism 5 includes a ball screw 50 extending in the Z direction, a pair of guide rails 51 extending parallel to the ball screw 50, a motor 52 connected to the upper end of the ball screw 50 for rotating the ball screw 50, and a movable plate 53 having an internal nut threadedly engaged with the ball screw 50 and a side portion (rear surface) slidably engaging with the guide rails 51. Accordingly, when the motor 52 is operated to rotate the ball screw 50, the movable plate 53 is moved back and forth in the Z direction as being guided by the guide rails 51. The polishing unit 7 is fixed to the front surface of the movable plate 53, so that the polishing unit 7 can be moved in the Z direction by the movement of the movable plate 53.

As depicted in FIG. 1, the polishing unit 7 includes a spindle 70 having an axis extending in the Z direction, a housing 71 for rotatably supporting the spindle 70, a motor 72 for rotating the spindle 70, a disk-shaped mount 73 connected to the lower end of the spindle 70, a disk-shaped platen 74 mounted on the lower surface of the mount 73, a polishing pad 76 mounted on the lower surface of the platen 74, and a holder 75 for supporting the housing 71, the holder 75 having a side surface (rear surface) fixed to the movable plate 53 of the vertical moving mechanism 5.

The polishing pad 76 has a circular shape as viewed in plan. For example, the polishing pad 76 is formed from a nonwoven fabric such as felt. The diameter of the polishing pad 76 is substantially the same as the diameter of the platen 74 and larger than the diameter of the wafer W to be held on the holding surface 300a of the holding unit 30.

For example, as depicted in FIG. 2, the holder 75 has a bottom plate 75b and a side plate 75c. Three holder load sensors 77 (only two of which being depicted in FIG. 2) are interposed between the bottom plate 75b and the side plate 75c of the holder 75. Each holder load sensor 77 functions to measure a load applied from the polishing pad 76 to the wafer W held on the holding surface 300a of the holding unit 30. The three holder load sensors 77 are arranged at equal intervals of 120 degrees along the outer circumference of the polishing pad 76, that is, located at the three vertices of a regular triangle. Each holder load sensor 77 is fixed by a fastening bolt 773 between the bottom plate 75b and the side plate 75c of the holder 75. For example, each holder load sensor 77 is configured by a dynamometer using a piezoelectric element as manufactured by Kistler Instrumente AG. As a modification, the polishing apparatus 1 may include at least one kind of the holder load sensors 77 and the table load sensors 38. That is, either the holder load sensors 77 or the table load sensors 38 may be omitted.

A polishing fluid passage (not depicted) is formed inside the spindle 70, the mount 73, and the platen 74 so as to extend in the Z direction. As depicted in FIG. 1, a polishing fluid source 79 for supplying a polishing fluid is connected to this polishing fluid passage. Accordingly, the polishing fluid is supplied from the polishing fluid source 79 through the polishing fluid passage to the polishing pad 76. That is, the polishing fluid passage has a lower end opening connected to the polishing pad 76. The polishing pad 76 has a lower surface adapted to come into contact with the wafer W. A plurality of crossing grooves (not depicted) is formed on the lower surface of the polishing pad 76. Accordingly, the polishing fluid supplied to the polishing pad 76 is allowed to mainly flow in the crossing grooves formed on the lower surface of the polishing pad 76 and thereby spread over the whole of the lower surface of the polishing pad 76. While the polishing apparatus 1 is so configured as to perform chemical mechanical polishing (CMP) using a polishing fluid, dry polishing for the wafer W may be performed by the polishing apparatus 1.

For example, as depicted in FIG. 1, the polishing apparatus 1 includes a control unit 9 for controlling each component. The control unit 9 includes a central processing unit (CPU) for performing computations. The control unit 9 is electrically connected to each component. For example, the control unit 9 controls the vertical moving mechanism 5 to vertically move the polishing unit 7 and also controls the motor 72 of the polishing unit 7 to rotate the polishing pad 76. The control unit 9 includes a storing portion 90 such as a memory and a determining portion 91 to be hereinafter described.

The control unit 9 is connected through wired or wireless communication lines to the holder load sensors 77 and the table load sensors 38 depicted in FIG. 2. In each of the holder load sensors 77 and the table load sensors 38, the piezoelectric element constituting each sensor is slightly deformed by a load applied to generate a potential difference corresponding to the load in the piezoelectric element. Due to the generation of the potential difference in the piezoelectric element, a load detection signal is transmitted from each sensor to the control unit 9.

First Preferred Embodiment of the Wafer Polishing Method: Polishing for a Thin Wafer There will now be described a wafer polishing method in the case of polishing the upper surface Wb of the wafer W by using the polishing apparatus 1 depicted in FIGS. 1 and 2. In actually polishing the wafer W by using the polishing apparatus 1, a setup operation is performed to grasp a relative distance in the Z direction from the holding surface 300a of the holding unit 30 to the lower surface of the polishing pad 76 with high accuracy. For example, the polishing unit 7 is lowered until the lower surface of the polishing pad 76 comes into contact with the holding surface 300a of the holding unit 30. At this time, the vertical position of the polishing unit 7 is defined as a feed start position of the polishing unit 7. Then, the control unit 9 grasps the above relative distance from the above feed start position, and this relative distance is stored into the storing portion 90 in the control unit 9. However, this setup operation may not be performed.

Further, the storing portion 90 previously stores the thickness (e.g., 3.5 mm) of the thickest one of the plural wafers W having different thicknesses as stored in the wafer cassette 21. Alternatively, the operator may input this thickness of the thickest wafer W through input means (not depicted) (e.g., touch panel or keyboard included in the polishing apparatus 1), thereby storing this thickness into the storing portion 90. Further, from the data on the thickness of the thickest wafer W and the data on the relative distance from the holding surface 300a to the lower surface of the polishing pad 76 in the Z direction as grasped by the setup operation, a predetermined gap is defined between the lower surface of the polishing pad 76 and the upper surface Wb of the thickest wafer W held on the holding surface 300a of the holding unit 30, and a standby position Z1 (see FIG. 3) of the polishing pad 76 is set above the upper surface Wb of the thickest wafer W by this predetermined gap. This standby position Z1 is grasped by the control unit 9 and stored into the storing portion 90. Note that, in FIG. 3, the graph F1 is a graph depicting a change in vertical position of the polishing pad 76.

In the case that the thickness of the thickest one of the plural wafers W having different thicknesses as stored in the wafer cassette 21 depicted in FIG. 1 is 3.5 mm, the standby position Z1 is set as a vertical position above a vertical position Z0 (see FIG. 3) of the upper surface Wb of the thickest wafer W held on the holding surface 300a of the holding unit 30 by a distance of 0.1 mm, that is, the standby position Z1 is set as a vertical position above the holding surface 300a by a distance of 3.6 mm. That is, the lower surface of the polishing pad 76 is located at this standby position Z1 before polishing.

Note that, in the processing conditions (device data) to be set in the polishing apparatus 1, the assumable value for the thickness of the thickest one of the plural wafers W having different thicknesses (input thicknesses) before polishing is set to 3.5 mm (which will be hereinafter referred to as an assumable largest thickness). This value is input into the control unit 9 by the operator and stored into the storing portion 90 of the control unit 9.

(1) Standby Position Taking Step

First, one of the plural wafers W is drawn from the wafer cassette 21 depicted in FIG. 1 by operating transfer means (not depicted). Thereafter, the wafer W is placed on the holding surface 300a of the holding unit 30 in the condition where the upper surface Wb of the wafer W is oriented upward. At this time, the center of the wafer W is made to substantially coincide with the center of the holding unit 30. Thereafter, the vacuum source connected to the holding unit 30 is operated to produce a suction force and transmit the suction force to the holding surface 300a, thereby holding the wafer W on the holding surface 300a under suction. In the first preferred embodiment, it is assumed that the wafer W held on the holding surface 300a of the holding unit 30 is a thin wafer W having a thickness smaller than the average of the different thicknesses of all the plural wafers W stored in the wafer cassette 21.

Thereafter, the holding unit 30 holding the thin wafer W is moved in the Y direction to the position below the polishing pad 76 of the polishing unit 7. At this time, the thin wafer W held on the holding unit 30 is positioned with respect to the polishing pad 76 in the following manner. That is, the holding unit 30 is positioned so that the polishing pad 76 always comes into abutment against the whole of the upper surface Wb of the wafer W during polishing and that the lower end opening of the polishing fluid passage opening at the center of the polishing pad 76 is closed by the upper surface Wb of the wafer W. Note that, while the outer circumference of the polishing pad 76 partially coincides with the outer circumference of the wafer W as depicted in FIG. 2, this configuration is merely illustrative.

Initially, the polishing unit 7 is set at an original vertical position above the standby position Z1. The vertical moving mechanism 5 is controlled by the control unit 9 to lower the polishing unit 7 from the original vertical position at a predetermined speed higher than a lowering speed (polish feed speed) set in polishing the wafer W after bringing the polishing pad 76 into contact with the wafer W. The vertical position of the polishing unit 7 after starting the lowering from the original vertical position is always grasped by the control unit 9. Thus, the polishing unit 7 is lowered from the original vertical position by the vertical moving mechanism 5 until the vertical position of the lower surface of the polishing pad 76 of the polishing unit 7 becomes the standby position Z1 where a predetermined gap is defined between the upper surface Wb of the thin wafer W and the lower surface of the polishing pad 76. This predetermined gap is larger than 0.1 mm because the thin wafer W is held on the holding surface 300a.

Note that, in the case that the motor 52 of the vertical moving mechanism 5 is a servo motor, the operation of the vertical moving mechanism 5 is controlled by the control unit 9 in the following manner. A rotary encoder in the servo motor is connected to the control unit 9 also having a function as a servo amplifier. An operating signal is supplied from an output interface in the control unit 9 to the servo motor. Thereafter, a rotational speed of the servo motor is output as an encoder signal from the rotary encoder to an input interface in the control unit 9. The control unit 9 having received the encoder signal can sequentially recognize the vertical position of the lower surface of the polishing pad 76 and lower the polishing unit 7 at a desired speed. Further, the motor 72 is controlled by the control unit 9 to rotate the spindle 70 and thereby rotate the polishing pad 76 at a predetermined speed.

(2-1) First Lowering Step

Figure 3:
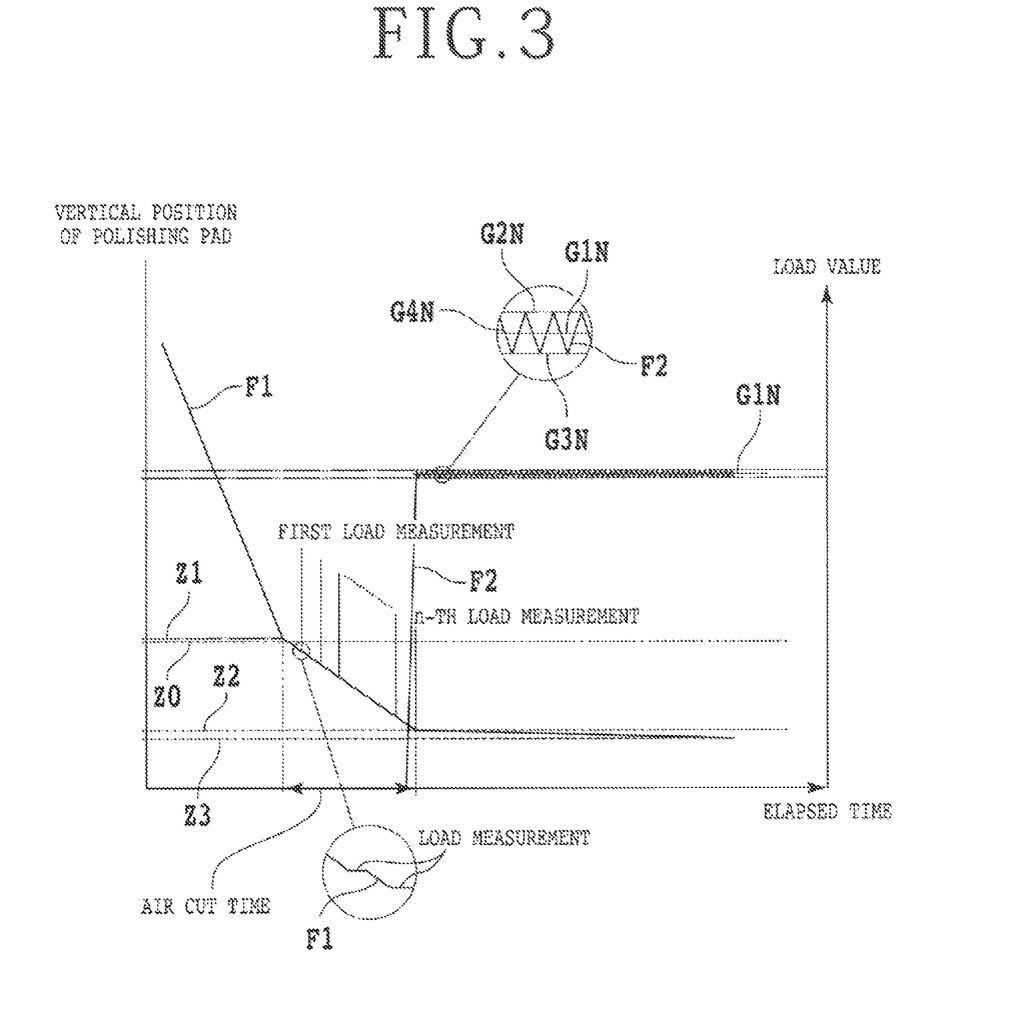
FIG. 3 is a combination of a graph depicting a change in vertical position of a polishing pad and a graph depicting a change in load value measured by a holder load sensor in the case of polishing a thin wafer by using a wafer polishing method according to the present invention.

After lowering the polishing pad 76 to the standby position Z1 depicted in FIGS. 2 and 3, the vertical moving mechanism 5 is controlled by the control unit 9 to further lower the polishing pad 76 by a preset distance at a preset speed and then stop this lowering. More specifically, the vertical moving mechanism 5 is operated to lower the polishing pad 76 by a preset distance of 50 μm at a preset lowering speed of 2 mm/s as an air cut lowering speed and then stop this lowering. This lowering operation is called step feed. Note that the preset lowering speed of 2 mm/s mentioned above is higher than a conventional air cut lowering speed (idle feed speed) in the conventional polishing method. Further, the values for the preset distance and the preset lowering speed mentioned above may be changed to suitable values according to the kind of the polishing pad 76, for example. Further, the preset distance is a distance such that when the polishing pad 76 above the wafer W is lowered to come into contact with the wafer W, a load value measured by each holder load sensor 77 becomes smaller than a preset threshold value. That is, this preset distance may fall within the amount of collapse of the polishing pad 76.

(3-1) First Determining Step

After stopping the lowering of the polishing pad 76 in the first lowering step, it is determined whether or not the load value measured by each holder load sensor 77 is greater than or equal to the preset threshold value. As a modification, this determining step may be performed on the basis of a load value measured by each table load sensor 38 rather than each holder load sensor 77.

For example, a threshold value G1N (see FIG. 3) is previously stored in the storing portion 90 of the control unit 9, in which the threshold value G1N is compared with the load value measured by each holder load sensor 77 in polishing the wafer W. This threshold value G1N is a value selected experimentally, empirically, or theoretically. This threshold value G1N is a load value to be used by the determining portion 91 of the control unit 9 in determining whether or not the lower surface of the polishing pad 76 has come into contact with the upper surface Wb of the wafer W. In FIG. 3, the graph F2 depicts a change in load value measured by each holder load sensor 77.

The threshold value G1N depicted in FIG. 3 is an intermediate value in a predetermined load range between an upper limit G2N and a lower limit G3N. This predetermined load range between the upper limit G2N and the lower limit G3N is a range selected experimentally, empirically, or theoretically. This predetermined load range is a load range stored in the storing portion 90 for the purpose of properly polishing the upper surface Wb of the wafer W by using the polishing pad 76.

As depicted in FIG. 3, in the first load measurement by each holder load sensor 77 in the first determining step, the load value measured by each holder load sensor 77 is not greater than or equal to the threshold value G1N. Accordingly, the determining portion 91 of the control unit 9 compares the load value (e.g., 0N) measured by each holder load sensor 77 with the threshold value G1N and determines that the load value measured by each holder load sensor 77 is less than the threshold value G1N. During the measurement of the load by each holder load sensor 77, the lowering of the polishing pad 76 remains stopped. However, this time duration of stop of the lowering is very short, e.g., approximately 0.5 sec for stable measurement by each holder load sensor 77.

(4-1) First Repeating Step

Since it has been determined that the load value measured by each holder load sensor 77 is less than the threshold value G1N in the first determining step, the above lowering step and the above determining step are repeated.

(2-2) n-th Lowering Step

After repeating the above lowering step and the above determining step plural times, the polishing pad 76 is lowered by the preset distance of 50 μm at the preset speed of 2 mm/s (step feed), so that the vertical position of the lower surface of the polishing pad 76 of the polishing unit 7 becomes a contact vertical position Z2 depicted in FIG. 3 where the lower surface of the polishing pad 76 comes into contact with the upper surface Wb of the thin wafer W.

(3-2) n-th Determining Step

After stopping the lowering of the polishing pad 76 in the n-th lowering step, it is determined whether or not the load value measured by each holder load sensor 77 is greater than or equal to the preset threshold value G1N. As depicted in FIG. 3, in the n-th load measurement by each holder load sensor 77 in the n-th determining step, the load value measured by each holder load sensor 77 is a load value G4N greater than or equal to the threshold value G1N. The determining portion 91 of the control unit 9 compares the load value G4N with the threshold value G1N and determines that the load value G4N is greater than or equal to the threshold value G1N. Accordingly, the determining portion 91 determines that the polishing pad 76 has just come into contact with the upper surface Wb of the wafer W.

Note that, as described above, when the polishing pad 76 is lowered by the predetermined distance from the standby position Z1 to the contact vertical position Z2, the polishing pad 76 comes into contact with the upper surface Wb of the wafer W. Alternatively, when the load value G4N measured by each holder load sensor 77 becomes greater than or equal to the threshold value G1N, the determining portion 91 may determine the contact of the polishing pad 76 with the upper surface Wb of the wafer W.

(4-2) n-th Repeating Step

Since it has been determined that the load value measured by each holder load sensor 77 is greater than or equal to the threshold value G1N in the n-th determining step, the lowering step and the determining step are not repeated any more. That is, the n-th repeating step is not performed. Thereafter, a polishing step to be hereinafter described is performed. In the n-th determining step, it is not essential that each holder load sensor 77 measures the load value G4N greater than or equal to the threshold value G1N, and it is sufficient that at least one of the three holder load sensors 77 must measure the load value G4N greater than or equal to the threshold value G1N. Also in this case, the n-th repeating step is not performed, and the polishing step is next performed.

(5) Polishing Step

Since it has been determined that the load value G4N measured by each holder load sensor 77 is greater than or equal to the threshold value G1N in the n-th determining step, the wafer W is polished in the condition where the load in the predetermined load range between the upper limit G2N and the lower limit G3N is applied to the wafer W, in which the threshold value G1N is included in this predetermined load range (polishing step).

In the polishing step, after the polishing pad 76 has come into contact with the upper surface Wb of the wafer W, the polishing unit 7 is further lowered at a predetermined polish feed speed by controlling the vertical moving mechanism 5, in which this predetermined polish feed speed is lower than the air cut lowering speed as the speed of lowering of the polishing unit 7 from the standby position Z1 to the contact vertical position Z2. That is, the lower surface of the polishing pad 76 is kept in pressure contact with the upper surface Wb of the wafer W during polishing. Further, in the polishing step, the holding unit 30 is rotated at a predetermined speed to thereby rotate the wafer W held on the holding surface 300a, so that the whole of the upper surface Wb of the wafer W is polished by the polishing pad 76 being rotated.

Further, in the polishing step, a slurry (polishing fluid) is supplied to an area where the wafer W is in contact with the polishing pad 76 during polishing. More specifically, the slurry is a polishing fluid containing $SiO_2$ or $Al_2O_3$ as loose abrasive. The slurry is supplied from the polishing fluid source 79 depicted in FIG. 1 through the polishing fluid passage extending through the spindle 70, the mount 73, and the platen 74 to the area where the wafer W is in contact with the polishing pad 76.

Further, in the polishing step, under the control by the control unit 9, the operating signal to be supplied to the motor 52 of the vertical moving mechanism 5 is decreased to thereby decrease the pressure applied from the polishing pad 76 to the wafer W, and the operating signal to be supplied to the motor 52 is increased to thereby increase the pressure applied from the polishing pad 76 to the wafer W. Such a change in pressure applied from the polishing pad 76 to the wafer W is performed at predetermined time intervals. On the other hand, the determining portion 91 always monitors variations in load value sent from each holder load sensor 77. On the basis of the above predetermined time intervals or the monitoring of the variations in load value, the wafer W is polished by the polishing pad 76 by applying a proper load falling in the predetermined load range between the upper limit G2N and the lower limit G3N, in which the threshold value G1N is included in this predetermined load range.

As controlling a polishing time period (polishing amount) is controlled, the polishing unit 7 is fed until the vertical position of the lower surface of the polishing pad 76 becomes a polish end vertical position Z3 depicted in FIG. 3. When this polish end vertical position Z3 is reached, the polishing step is ended. Thereafter, the polishing unit 7 is raised by the vertical moving mechanism 5 to thereby separate the polishing pad 76 from the wafer W.

As described above, the wafer polishing method according to the first preferred embodiment of the present invention includes the standby position taking step of moving the polishing pad 76 to the standby position Z1 where a gap is defined between the upper surface Wb of the wafer W held on the holding surface 300a and the lower surface of the polishing pad 76, the lowering step of lowering the polishing pad 76 by a preset distance at a preset speed (e.g., a lowering speed higher than the conventional air cut lowering speed) by using the vertical moving mechanism 5 after performing the standby position taking step, the determining step of determining whether or not the load value measured by each holder load sensor 77 is greater than or equal to the preset threshold value G1N in a rest condition of the polishing pad 76 after performing the lowering step, the repeating step of repeating the lowering step and the determining step until it is determined that the load value measured by each holder load sensor 77 is greater than or equal to the threshold value G1N, and the polishing step of polishing the wafer W in the condition where a load falling in the predetermined load range between the upper limit G2N and the lower limit G3N is applied to the wafer W, the threshold value G1N being included in the predetermined load range, when it has been determined that the load value measured by each holder load sensor 77 is greater than or equal to the threshold value G1N. With this configuration, even when the plural wafers W stored in the wafer cassette 21 have different thicknesses, the thin wafers W can be properly polished. That is, even when the thin wafers W have different thicknesses, an air cut operation can be similarly performed and each wafer W can be polished under the same polishing load (in the predetermined load range between the upper limit G2N and the lower limit G3N, this load range including the threshold value G1N). As a result, it is possible to prevent an increase in time (air cut time) elapsed until the lower surface of the polishing pad 76 comes into contact with the upper surface Wb of the wafer W.

Figure 4:
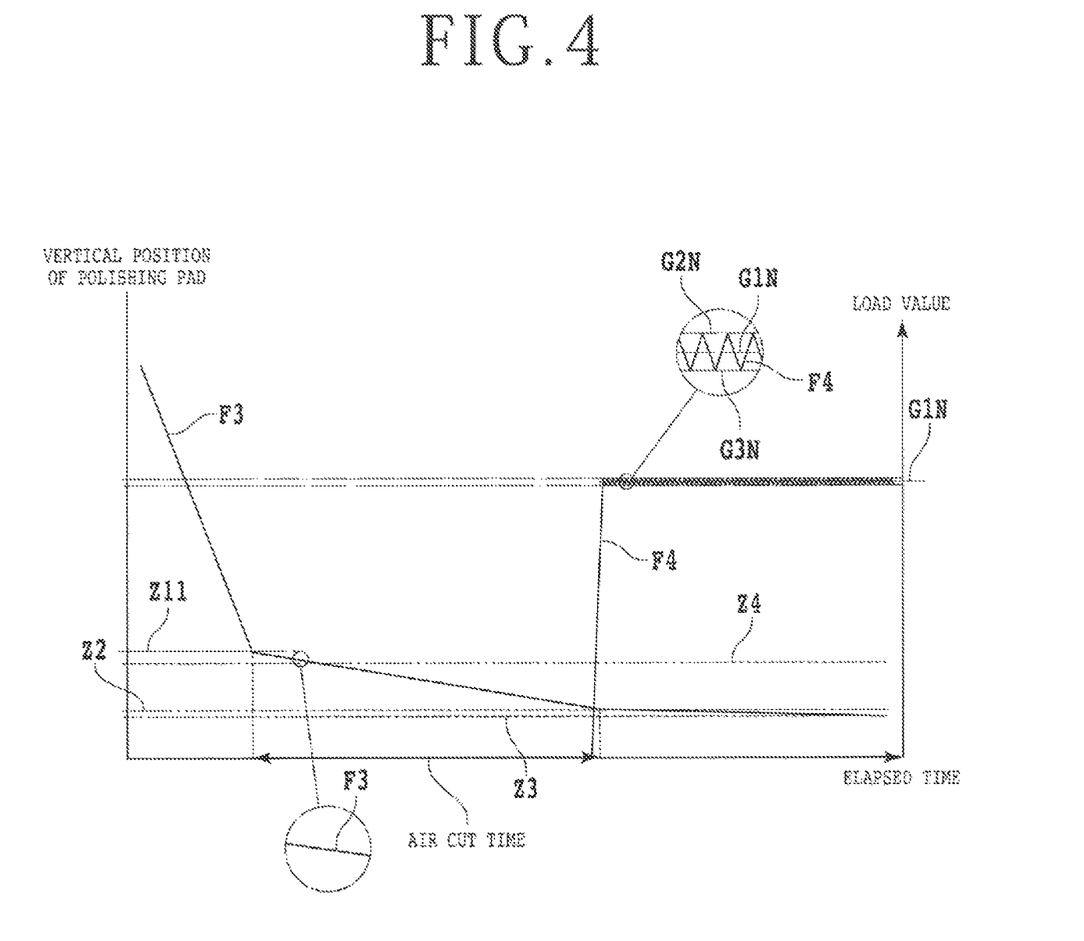
FIG. 4 is a combination of a graph depicting a change in vertical position of a polishing pad and a graph depicting a change in load value measured by a holder load sensor in the case of polishing a thin wafer by using the conventional polishing method, the thin wafer having a thickness smaller than a set thickness.

In FIG. 4, the graph F3 is a graph depicting a change in vertical position of the polishing pad 76 in a conventional polishing method for a wafer W (wafer W having a thickness smaller than a set thickness). The set thickness in the conventional polishing method is an average value of the different thicknesses of all the plural wafers W stored in the wafer cassette 21. In FIG. 4, the graph F4 is a graph depicting a change in load value measured by each holder load sensor 77 in the conventional polishing method for the thin wafer W having a thickness smaller than the set thickness. In the conventional polishing method for the thin wafer W, the polishing unit 7 is first lowered until the vertical position of the lower surface of the polishing pad 76 becomes an air cut start position Z11. Thereafter, the step feed of the polishing unit 7 by the vertical moving mechanism 5 is not performed, but the polishing unit 7 is lowered at an air cut lowering speed (e.g., 5 μm/s) lower than the air cut lowering speed (e.g., 2 mm/s) used in the present invention. Note that, in the case that the wafer W having the set thickness is held on the holding unit 30, the air cut start position Z11 is set above a contact vertical position Z4 where the lower surface of the polishing pad 76 comes into contact with the upper surface Wb of the wafer W having the set thickness by a predetermined distance (e.g., 0.1 mm). As apparent from FIG. 4, the time (air cut time) elapsed until the lower surface of the polishing pad 76 comes into contact with the upper surface Wb of the wafer W is longer than the air cut time depicted in FIG. 3 depicting the first preferred embodiment of the present invention. As understood from FIG. 3, the air cut time can be reduced in the wafer polishing method according to the first preferred embodiment of the present invention.

In the case that the thickness of the wafer W is 50 μm and the air cut start position Z11 is set above the upper surface Wb of the wafer W by 100 μm, the air cut time in the conventional polishing method becomes 20 sec with a lowering speed of 5 μm/s. To the contrary, in the first preferred embodiment of the present invention, the step feed is started at the vertical position above the holding surface 300a of the holding unit 30 by 3.6 mm in such a manner that the polishing pad 76 is lowered by the distance of 50 μm at the speed of 2 mm/s in each step of the step feed. Further, after lowering the polishing pad 76 in each step of the step feed, the load value is measured in a time duration of 0.2 sec. Accordingly, the number of steps in this step feed becomes 71, so that the air cut time becomes approximately 16 sec.

Figure 5:
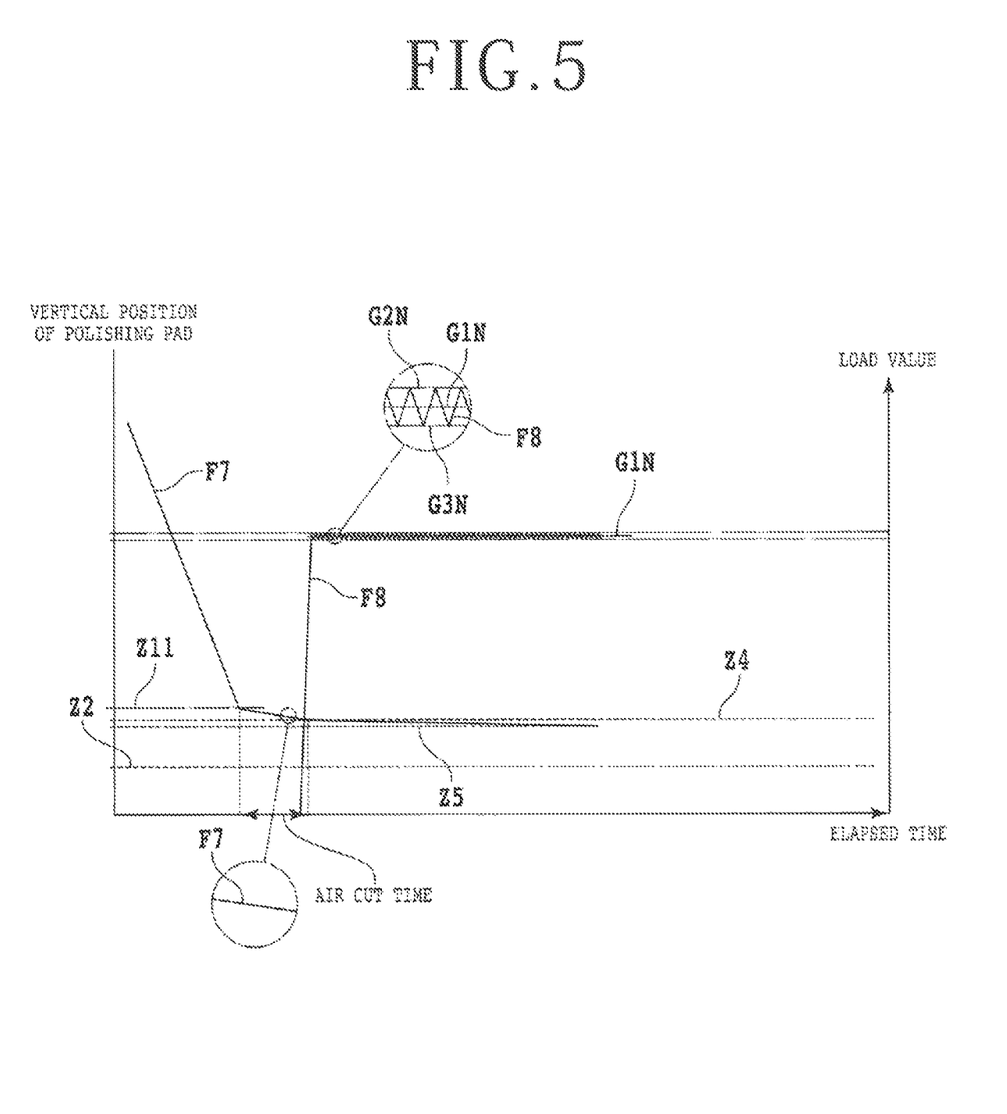
FIG. 5 is a combination of a graph depicting a change in vertical position of a polishing pad and a graph depicting a change in load value measured by a holder load sensor in the case of polishing a wafer having the set thickness by using the conventional polishing method.

In FIG. 5, the graph F7 is a graph depicting a change in vertical position of the polishing pad 76 in the conventional polishing method for the wafer W (wafer W having the set thickness). Further, in FIG. 5, the graph F8 is a graph depicting a change in load value measured by each holder load sensor 77 in the conventional polishing method for the wafer W having the set thickness. In the conventional polishing method for the wafer W having the set thickness, the polishing unit 7 is first lowered until the vertical position of the lower surface of the polishing pad 76 becomes the air cut start position Z11. Thereafter, the step feed of the polishing unit 7 by the vertical moving mechanism 5 is not performed, but the polishing unit 7 is lowered at the air cut lowering speed (e.g., 5 μm/s) lower than the air cut lowering speed (e.g., 2 mm/s) used in the present invention. Note that, in the case that the wafer W having the set thickness is held on the holding unit 30, the air cut start position Z11 is set above the contact vertical position Z4 where the lower surface of the polishing pad 76 comes into contact with the upper surface Wb of the wafer W having the set thickness by a predetermined distance (e.g., 0.1 mm). Also in this case, the air cut time elapsed until the lower surface of the polishing pad 76 comes into contact with the upper surface Wb of the wafer W becomes longer than that in the first preferred embodiment of the present invention.

Second Preferred Embodiment of the Wafer Polishing Method: Polishing for a Thick Wafer There will now be described a wafer polishing method in the case of polishing the upper surface Wb of the wafer W as a thick wafer by using the polishing apparatus 1 depicted in FIGS. 1 and 2. In actually polishing the wafer W by using the polishing apparatus 1, a setup operation is performed to grasp a relative distance in the Z direction from the holding surface 300a of the holding unit 30 to the lower surface of the polishing pad 76 with high accuracy.

Figure 6:
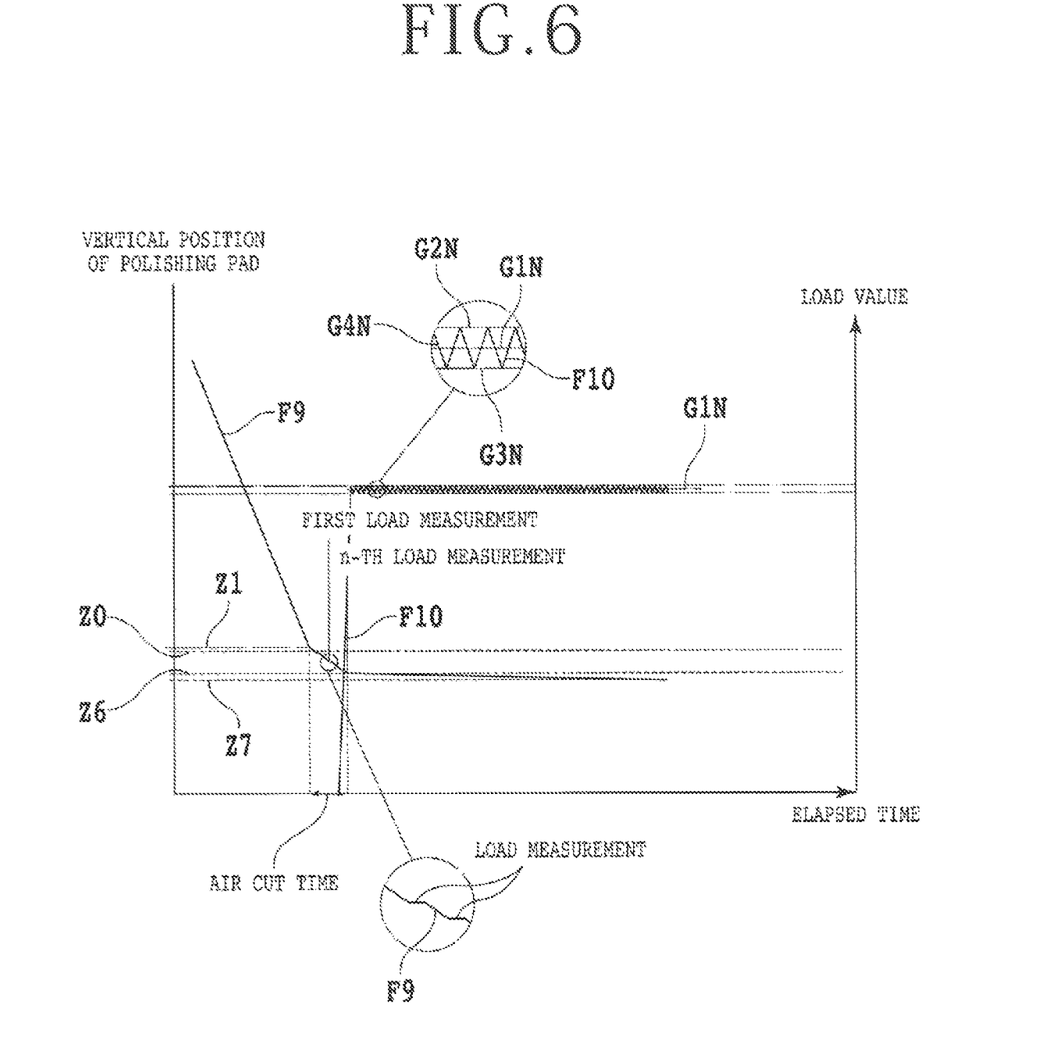
FIG. 6 is a combination of a graph depicting a change in vertical position of a polishing pad and a graph depicting a change in load value measured by a holder load sensor in the case of polishing a thick wafer by using the wafer polishing method according to the present invention.

From the data on the thickness (e.g., 3.5 mm) of the thickest wafer W and the data on the relative distance from the holding surface 300a to the lower surface of the polishing pad 76 in the Z direction as grasped by the setup operation, a predetermined gap (e.g., 0.1 mm) is defined between the lower surface of the polishing pad 76 and the upper surface Wb of the thickest wafer W held on the holding surface 300a of the holding unit 30, and a standby position Z1 (see FIG. 6) of the polishing pad 76 is set above the upper surface Wb of the thickest wafer W by this predetermined gap. This standby position Z1 is grasped by the control unit 9 and stored in the storing portion 90. In FIG. 6, the graph F9 is a graph depicting a change in vertical position of the polishing pad 76.

(1) Standby Position Taking Step

First, one of the plural wafers W is drawn from the wafer cassette 21 depicted in FIG. 1 by operating transfer means (not depicted). Thereafter, the wafer W is held under suction on the holding surface 300a of the holding unit 30 in the condition where the upper surface Wb of the wafer W is oriented upward and the center of the wafer W is made to substantially coincide with the center of the holding unit 30.

Note that, in the second preferred embodiment, it is assumed that the wafer W held on the holding surface 300a of the holding unit 30 is a thick wafer W having a thickness larger than the average of the different thicknesses of all the plural wafers W stored in the wafer cassette 21.

Thereafter, the holding unit 30 holding the thick wafer W is moved in the Y direction to the position below the polishing pad 76 of the polishing unit 7. At this time, the thick wafer W held on the holding unit 30 is positioned with respect to the polishing pad 76 in the same manner as that used in the first preferred embodiment.

Initially, the polishing unit 7 is set at an original vertical position above the standby position Z1. The vertical moving mechanism 5 is controlled by the control unit 9 to lower the polishing unit 7 from the original vertical position at a predetermined speed higher than a lowering speed (polish feed speed) set in polishing the wafer W after bringing the polishing pad 76 into contact with the wafer W. Further, the vertical position of the polishing unit 7 after starting the lowering from the original vertical position is always grasped by the control unit 9. Thus, the polishing unit 7 is lowered from the original vertical position by the vertical moving mechanism 5 until the vertical position of the lower surface of the polishing pad 76 of the polishing unit 7 becomes the standby position Z1 where a predetermined gap is defined between the upper surface WB of the thick wafer W and the lower surface of the polishing pad 76. In the second preferred embodiment, this predetermined gap is 0.1 mm. Further, the motor 72 depicted in FIG. 1 is operated to rotate the spindle 70 and accordingly rotate the polishing pad 76 at a predetermined speed.

(2-1) First Lowering Step

After lowering the polishing pad 76 to the standby position Z1 depicted in FIGS. 2 and 6, the vertical moving mechanism 5 is controlled by the control unit 9 to further lower the polishing pad 76 by a preset distance of 50 μm at a preset air cut lowering speed of 2 mm/s and then stop this lowering. This lowering operation is called step feed. The preset air cut lowering speed of 2 mm/s mentioned above is higher than a conventional air cut lowering speed in the conventional polishing method.

(3-1) First Determining Step

After stopping the lowering of the polishing pad 76 in the first lowering step, it is determined whether or not the load value measured by three holder load sensors 77 is greater than or equal to the preset threshold value. For example, a threshold value G1N depicted in FIG. 6 is previously stored in the storing portion 90 of the control unit 9. This threshold value G1N is an intermediate value in a predetermined load range between an upper limit G2N and a lower limit G3N. In the first load measurement by each holder load sensor 77 in the first determining step, the load value measured by each holder load sensor 77 is not greater than or equal to the threshold value G1N. Accordingly, the determining portion 91 of the control unit 9 compares the load value (e.g., ON) measured by each holder load sensor 77 with the threshold value G1N and determines that the load value measured by each holder load sensor 77 is less than the threshold value G1N.

Note that, in FIG. 6, the graph F10 depicts a change in load value measured by each holder load sensor 77. In addition, during the measurement of the load by each holder load sensor 77, the lowering of the polishing pad 76 remains stopped. However, this time duration of stop of the lowering is very short, e.g., approximately 0.5 sec.

(4-1) First Repeating Step

Since it has been determined that the load value measured by each holder load sensor 77 is less than the threshold value G1N in the first determining step, the above lowering step and the above determining step are repeated.

(2-2) n-th Lowering Step

After repeating the above lowering step and the above determining step plural times, the polishing pad 76 is lowered by the preset distance of 50 µm at the preset speed of 2 mm/s (step feed), so that the vertical position of the lower surface of the polishing pad 76 of the polishing unit 7 becomes a contact vertical position Z6 depicted in FIG. 6 where the lower surface of the polishing pad 76 comes into contact with the upper surface Wb of the thick wafer W.

(3-2) n-th Determining Step

After stopping the lowering of the polishing pad 76 in the n-th lowering step, it is determined whether or not the load value measured by each holder load sensor 77 is greater than or equal to the preset threshold value G1N. As depicted in FIG. 6, in the n-th load measurement by each holder load sensor 77 in the n-th determining step, the load value measured by each holder load sensor 77 is a load value G4N greater than or equal to the threshold value G1N. The determining portion 91 of the control unit 9 compares the load value G4N with the threshold value G1N and determines that the load value G4N is greater than or equal to the threshold value G1N. Accordingly, the determining portion 91 determines that the polishing pad 76 has just come into contact with the upper surface Wb of the wafer W. Note that, as described above, when the polishing pad 76 is lowered by the predetermined distance from the standby position Z1 to the contact vertical position Z2, the polishing pad 76 comes into contact with the upper surface Wb of the wafer W. Alternatively, when the load value G4N measured by each holder load sensor 77 becomes greater than or equal to the threshold value G1N, the determining portion 91 may determine the contact of the polishing pad 76 with the upper surface Wb of the wafer W.

(4-2) n-th Repeating Step

Since it has been determined that the load value measured by each holder load sensor 77 is greater than or equal to the threshold value GIN in the n-th determining step, the lowering step and the determining step are not repeated any more. That is, the n-th repeating step is not performed. Thereafter, a polishing step to be hereinafter described is performed.

(5) Polishing Step

Since it has been determined that the load value G4N measured by each holder load sensor 77 is greater than or equal to the threshold value GIN in the n-th determining step, the wafer W is polished in the condition where the load in the predetermined load range between the upper limit G2N and the lower limit G3N is applied to the wafer W, in which the threshold value GIN is included in this predetermined load range (polishing step). In the polishing step, after the polishing pad 76 has come into contact with the upper surface Wb of the wafer W, the polishing unit 7 is further lowered at a predetermined polish feed speed by controlling the vertical moving mechanism 5. That is, the lower surface of the polishing pad 76 is kept in pressure contact with the upper surface Wb of the wafer W during polishing. Further, in the polishing step, the holding unit 30 is rotated and a slurry is supplied from the polishing fluid source 79 to an area where the wafer W is in contact with the polishing pad 76 during polishing.

Further, in the polishing step, under the control by the control unit 9, the wafer W is polished by the polishing pad 76 by applying a proper load falling in the predetermined load range between the upper limit G2N and the lower limit G3N, in which the threshold value G1N is included in this predetermined load range. As controlling a polishing time period, the polishing unit 7 is fed until the vertical position of the lower surface of the polishing pad 76 becomes a polish end vertical position Z7 depicted in FIG. 6. When this polish end vertical position Z7 is reached, the polishing step is ended. Thereafter, the polishing unit 7 is raised by the vertical moving mechanism 5 to thereby separate the polishing pad 76 from the wafer W.

As described above, the wafer polishing method according to the second preferred embodiment of the present invention includes the standby position taking step of moving the polishing pad 76 to the standby position Z1 where a gap is defined between the upper surface Wb of the wafer W held on the holding surface 300a and the lower surface of the polishing pad 76, the lowering step of lowering the polishing pad 76 by a preset distance at a preset speed (e.g., a lowering speed higher than the conventional air cut lowering speed) by using the vertical moving mechanism 5 after performing the standby position taking step, the determining step of determining whether or not the load value measured by each holder load sensor 77 is greater than or equal to the preset threshold value G1N in a rest condition of the polishing pad 76 after performing the lowering step, the repeating step of repeating the lowering step and the determining step until it is determined that the load value measured by each holder load sensor 77 is greater than or equal to the threshold value G1N, and the polishing step of polishing the wafer W in the condition where a load falling in the predetermined load range between the upper limit G2N and the lower limit G3N is applied to the wafer W, the threshold value G1N being included in the predetermined load range, when it has been determined that the load value measured by each holder load sensor 77 is greater than or equal to the threshold value G1N. With this configuration, even when the plural wafers W stored in the wafer cassette 21 have different thicknesses, the thick wafers W can be properly polished. That is, even when the thick wafers W have different thicknesses, each wafer W can be polished under the same polishing load, that is, in the predetermined load range between the upper limit G2N and the lower limit G3N, this load range including the threshold value G1N. Furthermore, there is no possibility that the polishing pad 76 lowering at a high speed before starting the air cut operation may come into contact with the upper surface Wb of the thick wafer W at this high speed. Accordingly, it is possible to eliminate the problem that a large load greater than an allowable value (greater than or equal to the upper limit G2N) may be applied to the wafer W to cause breakage of the wafer W.

Figure 7:
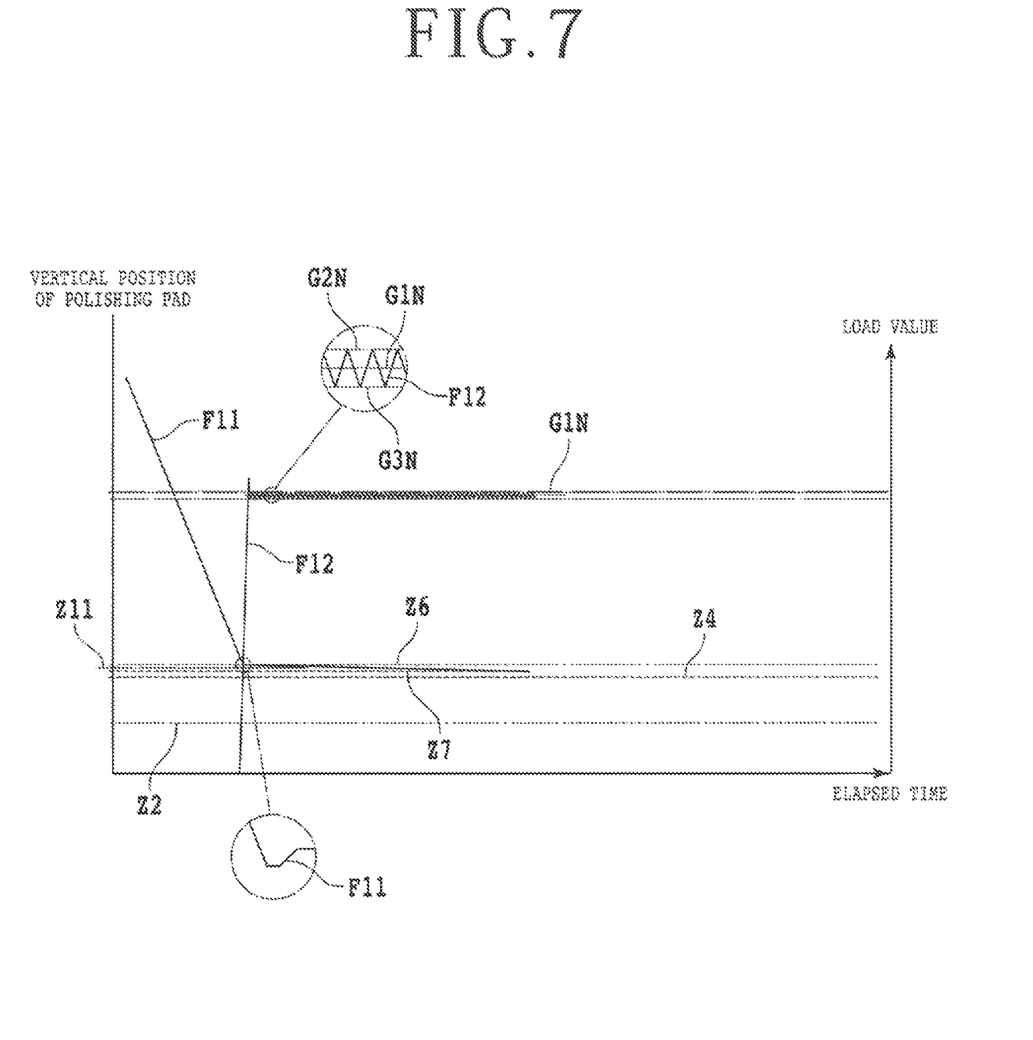
FIG. 7 is a combination of a graph depicting a change in vertical position of a polishing pad and a graph depicting a change in load value measured by a holder load sensor in the case of polishing a thick wafer by using the conventional polishing method, the thick wafer having a thickness larger than the set thickness.

In FIG. 7, the graph F11 is a graph depicting a change in vertical position of the polishing pad 76 in a conventional polishing method for a wafer W (wafer W having a thickness larger than a set thickness). The set thickness in the conventional polishing method is an average value of the different thicknesses of all the plural wafers W stored in the wafer cassette 21, for example. In FIG. 7, the graph F12 is a graph depicting a change in load value measured by each holder load sensor 77 in the conventional polishing method for the thick wafer W having a thickness larger than the set thickness. In the conventional polishing method for the thick wafer W, the polishing unit 7 is first lowered until the vertical position of the lower surface of the polishing pad 76 becomes an air cut start position Z11. Thereafter, the step feed of the polishing unit 7 by the vertical moving mechanism 5 is not performed, but the polishing unit 7 is lowered at an air cut lowering speed (e.g., 5 μm/s) lower than the air cut lowering speed (e.g., 2 mm/s) used in the present invention. However, in the case that the wafer W having the set thickness is held on the holding unit 30, the air cut start position Z11 is set above a contact vertical position Z4 where the lower surface of the polishing pad 76 comes into contact with the upper surface Wb of the wafer W having the set thickness by a predetermined distance (e.g., 0.1 mm). Accordingly, in the case that the thick wafer W having a thickness larger than the set thickness is held on the holding unit 30, there is a possibility that the polishing pad 76 lowering to the air cut start position Z11 at a speed higher than the polish feed speed may collide with the upper surface Wb of the thick wafer W at this high lowering speed, so that a large load greater than or equal to an allowable value (greater than or equal to the upper limit G2N) may be applied to the wafer W to cause breakage of the wafer W.

The wafer polishing method according to the present invention is not limited to the above preferred embodiments. Further, the configuration of the polishing apparatus 1 depicted in the attached drawings is also merely illustrative. That is, the configuration may be suitably modified within the scope where the effect of the present invention can be exhibited.

The present invention is not limited to the details of the above described preferred embodiments. The scope of the invention is defined by the appended claim and all changes and modifications as fall within the equivalence of the scope of the claim are therefore to be embraced by the invention.

What is claimed is:

1. A wafer polishing method using a polishing apparatus including a holding unit having a holding surface for holding a wafer, a polishing unit having a polishing pad for polishing said wafer held on said holding surface of said holding unit in a condition where a lower surface of said polishing pad is in contact with an upper surface of said wafer, a vertical moving mechanism for moving said polishing unit in a vertical direction perpendicular to said holding surface, and a load sensor for measuring a load applied from said polishing pad to said wafer held on said holding surface, said wafer polishing method comprising:

a standby position taking step of moving said polishing pad to a standby position where a gap is defined between the upper surface of said wafer held on said holding surface and the lower surface of said polishing pad;

a lowering step of lowering said polishing pad by a preset distance at a preset speed by using said vertical moving mechanism after performing said standby position taking step;

a determining step of determining whether or not said load measured by said load sensor is greater than or equal to a preset threshold value in a rest condition of said polishing pad after performing said lowering step;

a repeating step of repeating said lowering step and said determining step until it is determined that said load measured by said load sensor is greater than or equal to said preset threshold value by said determining step; and     a polishing step of polishing said wafer in a condition where a load falling in a predetermined load range including said preset threshold value is applied to said wafer when it has been determined that said load measured by said load sensor is greater than or equal to said preset threshold value by said determining step.

\* \* \* \* \*